(12) United States Patent
Kumakura et al.

(10) Patent No.: US 6,592,783 B2
(45) Date of Patent: Jul. 15, 2003

(54) ANISOTROPIC CONDUCTIVE ADHESIVE FILM

(75) Inventors: Hiroyuki Kumakura, Kanuma (JP); Satoshi Yamamoto, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/779,480

(22) Filed: Feb. 9, 2001

(65) Prior Publication Data

US 2003/0102466 A1 Jun. 5, 2003

(30) Foreign Application Priority Data

Feb. 25, 2000 (JP) ........................................ 2000-050180

(51) Int. Cl.[7] .............................. H01B 1/20; H01B 1/22; H01B 5/16; H05K 3/30; H05K 3/32; C09J 7/02; C09J 9/02; B65H 81/00; H01R 12/00
(52) U.S. Cl. ..................... 252/500; 252/512; 252/514; 252/518; 252/513; 156/250; 156/327; 439/66; 439/591; 29/832; 29/840; 29/846; 29/878; 428/339; 428/327; 428/356; 428/407; 428/403; 523/442; 525/403; 525/408
(58) Field of Search ..................... 252/513, 514; 428/339, 327, 356, 407, 403; 156/327, 2.5; 523/442; 439/66, 591; 29/832, 840, 846, 878; 525/403, 408

(56) References Cited

U.S. PATENT DOCUMENTS 6,245,175 B1 * 6/2001 Hotta et al. .................. 156/172
6,328,844 B1 * 12/2001 Watanabe et al. ........... 156/330
6,352,775 B1 * 3/2002 Sasaki et al. ................ 428/403

* cited by examiner

Primary Examiner—Mark Kopec
Assistant Examiner—Kallambella Vijayakumar
(74) Attorney, Agent, or Firm—Oliff & Berridge, PLC

(57) ABSTRACT

An anisotropic conductive adhesive film contains a first insulating adhesive layer, a second insulating adhesive layer whose modulus of elasticity after curing is less than the modulus of elasticity of the cured first insulating adhesive layer, and electrically conductive particles which are dispersed in at least either the first insulating adhesive layer or the second insulating adhesive layer.

8 Claims, 1 Drawing Sheet

ANISOTROPIC CONDUCTIVE ADHESIVE FILM

BACKGROUND OF THE INVENTION

1. Field of the Invention

The present invention relates to anisotropic conductive adhesive films which are used in electrical and mechanical connections between electronic components such as semiconductor chips and circuit boards, and in particular relates to anisotropic conductive adhesive films which are suitable for use when flip-chip mounting semiconductor chips on polyester-based flexible circuit boards.

2. Description of the Related Art

In the past, anisotropic conductive adhesive films (ACF) have been used to effect electrical and mechanical connections between electronic components such as semiconductor chips and circuit boards, or between circuit boards; recently, however, in such applications as mobile telephones and IC cards in particular, anisotropic conductive adhesive films have come into wide use for flip-chip mounting (COF) IC chips on flexible circuit boards (FPC).

Anisotropic conductive adhesive films generally have a single layer structure, in which electrically conductive particles are dispersed in a single epoxy resin-based insulating adhesive layer. Other known structures include dual-layer structures comprising one insulating adhesive layer in which the electrically conductive particles have been dispersed and the other insulating adhesive layer of the same composition in which they are not so dispersed, or comprising an insulating adhesive layer in which the electrically conductive particles have been dispersed and a layer of that insulating adhesive with one or any components of the composition having been changed.

On the other hand, in mobile telephones, IC cards, and other applications there is a strong demand to keep costs low in order to provide a competitive price. Accordingly, in these applications polyester-based flexible circuit boards tend to be used instead of conventional polyimide-based ones.

However, polyester-based flexible circuit boards have poorer adhesion than polyimide-based ones, because of affection of the surface properties thereof. Conversely, if polyimide-based flexible circuit boards are replaced by polyester-based ones, the adhesion between the electronic component and the circuit board shall lower, owing to the high modulus of elasticity in anisotropic conductive adhesive films in which conventional epoxy resin-based insulating adhesives are employed.

In response to the above drawback, acrylate-based adhesives, which have high adhesion and a low modulus of elasticity, have been tested as insulating adhesives for anisotropic conductive adhesive films. However, another drawback has arisen in that the continuity reliability lowers, despite increased adhesion.

For these reasons, it has not been possible to achieve the required specifications with regard to adhesion and continuity reliability when using conventional anisotropic conductive adhesive films for mounting IC chips and other electronic components on polyester-based flexible circuit boards.

SUMMARY OF THE INVENTION

With the foregoing problems of the prior art in view, it is an object of the present invention to realize high adhesion and continuity reliability using anisotropic conductive adhesive films, even when mounting IC chips and other electronic components on polyester-based flexible circuit boards.

The present inventors perfected the present invention by discovering that by using an anisotropic conductive adhesive film when mounting IC chips and other electronic components on polyester-based flexible circuit boards, forming the insulating adhesive layer which constitutes the anisotropic conductive adhesive film into a multiple-layer configuration with one layer on the electronic component side and the other layer on the flexible circuit board side, and by making the modulus of elasticity after the insulating adhesive layer on the flexible circuit board side has been cured lower than the modulus of elasticity after the insulating adhesive layer on the electronic component side has cured, adhesion and continuity reliability will simultaneously increase.

In other words, the present invention provides an anisotropic conductive adhesive film comprising a first insulating adhesive layer and a second insulating adhesive layer whose modulus of elasticity after curing is less than the modulus of elasticity of the cured first insulating adhesive layer, in which electrically conductive particles have been dispersed in at least one of the first insulating adhesive layer and the second insulating adhesive layer.

Moreover, the present invention provides a method for electrically and mechanically connecting semiconductor chips with circuit boards by using the aforementioned anisotropic conductive adhesive film, in which the first insulating adhesive layer is disposed on the semiconductor chip side of the anisotropic conductive adhesive film and the second insulating adhesive layer is disposed on the circuit board side.

Furthermore, the present invention provides a connected structure assembly having a semiconductor chip and a circuit board electrically and mechanically connected thereto by using the aforementioned anisotropic conductive adhesive film, in which the semiconductor chips is bonded to the cured first insulating adhesive layer of the anisotropic conductive adhesive film and the circuit board is bonded to the cured second insulating adhesive layer.

DESCRIPTION OF THE PREFERRED EMBODIMENTS

Figure 1:
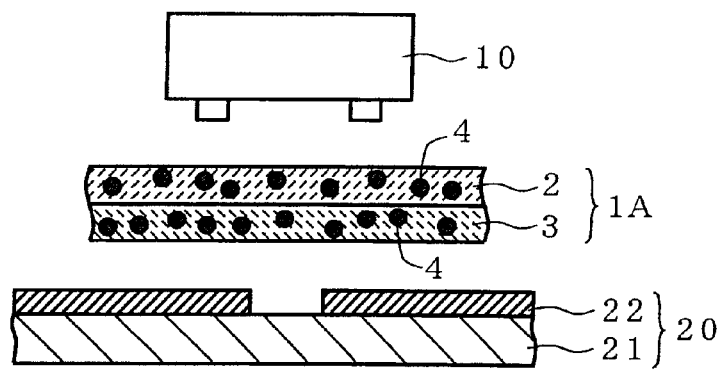
FIG. 1 is a descriptive diagram of a connection method pertaining to the present invention.

The present invention will be described in detail below with reference to the drawings. The symbols in the drawings refer to the same or similar structural elements.

FIG. 1 is a descriptive diagram of a method for connecting an IC chip 10 and a circuit board 20 using the anisotropic conductive adhesive film 1A pertaining to the present invention.

The anisotropic conductive adhesive film 1A comprises a dual-layer structure comprising a first insulating adhesive layer 2 and a second insulating adhesive layer 3, and electrically conductive particles 4 are dispersed respectively in both of these insulating adhesive layers 2,3.

The anisotropic conductive adhesive film 1A pertaining to the present invention is characterized in that the modulus of elasticity $c_1$ of the first insulating adhesive layer 2 after it has been cured is greater than the modulus of elasticity $c_2$ of the second insulating adhesive layer 3 after it has been cured. The ratio $c_1/c_2$ between the moduli of elasticity for the insulating adhesive layers 2,3 after they have been cured is preferably at least 10. Therefore, when the IC chip 10 and the circuit board 20 are connected using the anisotropic conductive adhesive film 1A, both the adhesion and the continuity reliability can be improved to at least the same level as observed with polyimide-based circuit boards by disposing the first insulating adhesive layer 2 on the IC chip 10 and the second insulating adhesive layer 3 on the circuit board 20, even if the circuit board 20 has been configured such that a wiring circuit 22 has been furnished on a base film 21 with a polyester base.

There are no particular limitations on the method used to maintain the difference between the respective moduli of elasticity of the insulating adhesive layers 2,3 after curing. However, it is preferable to use different types of insulating adhesive owing to the fact that if the same insulating adhesive is used, the difference in the moduli of elasticity after the two have been cured will not be sufficiently great, even if the type of curing agent and amount of same to be added have been adjusted. For example, the first insulating adhesive layer 2 can be formed from a thermosetting epoxy adhesive and the second insulating adhesive layer 3 can be formed from a thermosetting acrylate adhesive. It is particularly preferable from the standpoints of such properties as preservability and rapid curability for the first insulating adhesive layer 2 to be formed from a thermosetting epoxy adhesive in which an imidazole-based latent curing agent is employed, and for the second insulating adhesive layer 3 to be formed from a thermosetting acrylate adhesive in which a peroxide-based curing agent is employed. The thermosetting epoxy adhesive suited for use in such circumstances can be constituted from bisphenol-A, bisphenol-F, tetrabromobisphenol-A or another common epoxy resin. The thermosetting acrylate adhesive suited for use in such circumstances can be constituted from reactive double-bond containing urethane acrylate, polyester acrylate, or epoxy acrylate, among others.

It is preferable for the thickness ratio $t_1/t_2$ between the first insulating adhesive layer 2 and the second insulating adhesive layer 3 to be at least 0.15 and no greater than 7. If this ratio $t_1/t_2$ falls below 0.15, the forming effect of first insulating adhesive layer 2 shall not be effectively realized, and the continuity reliability will diminish. Conversely, if the ratio $t_1/t_2$ exceeds 7, the forming effect of the second insulating adhesive layer 3 will not be sufficiently realized, and the adhesion will diminish.

The combined thickness of the thickness $t_1$ of the first insulating adhesive layer 2 and the thickness $t_2$ of the second insulating adhesive layer 3 can be the same as a conventional single-layer anisotropic conductive adhesive film, with a range of 10–100 μm being preferable.

Any of various electrically conductive particles 4 which are used in conventional anisotropic conductive adhesive films can be used; examples of same include metal powders made of Ni, Ag, Cu, or an alloy of these, spherical resin particles whose surfaces have been metal-plated and particles which comprise good electrical conductors, whose surface has been furnished with an insulating resin coating. It is preferable for the size of the electrically conductive particles to be 0.2 to 20 μm. The electrically conductive particles 4 which are to be dispersed in the first insulating adhesive layer 2 can be the same as or different from those which are to be dispersed in the second insulating adhesive layer 3.

A method for manufacturing the anisotropic conductive adhensive film 1A involves dispersing the electrically conductive particles 4 respectively in the first insulating adhesive layer-forming composition and the second insulating adhesive layer-forming composition using a known method, forming the respective films, then contact bonding the two resulting films by placing one on top of the other. After forming either the first insulating adhesive layer 2 or the second insulating adhesive layer 3 in which the electrically conductive particles 4 have been dispersed, the other insulating adhesive forming composition, in which the electrically conductive particles have been dispersed, can be applied thereon to form the film. From the standpoint of mass production, the method involving the laying of one film on top of the other is preferable.

Figure 2:
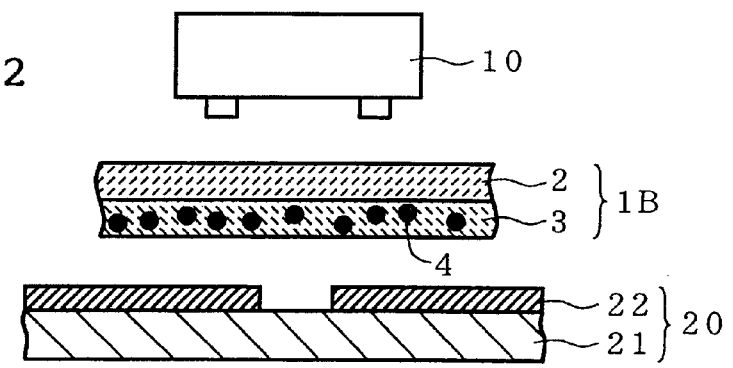
FIG. 2 is a descriptive diagram of a connection method pertaining to the present invention.

Various embodiments of the anisotropic conductive adhesive film pertaining to the present invention can be envisioned, provided that each of the two insulating adhesive layers has a different modulus of elasticity after curing. For example, in the anisotropic conductive adhesive film 1A as depicted in FIG. 1 described above, the electrically conductive particles 4 are dispersed in each of the first insulating adhesive layer 2 and the second insulating adhesive layer 3; however, as with the anisotropic conductive adhesive film 1B depicted in FIG. 2, it is possible for the electrically conductive particles 4 to be dispersed only in the second insulating adhesive layer 3, while not being dispersed in the first insulating adhesive layer 2. This configuration is preferable in fine patterns where the bump surface areas are small, as it allows most of the electrically conductive particles to be "captured".

Figure 3:
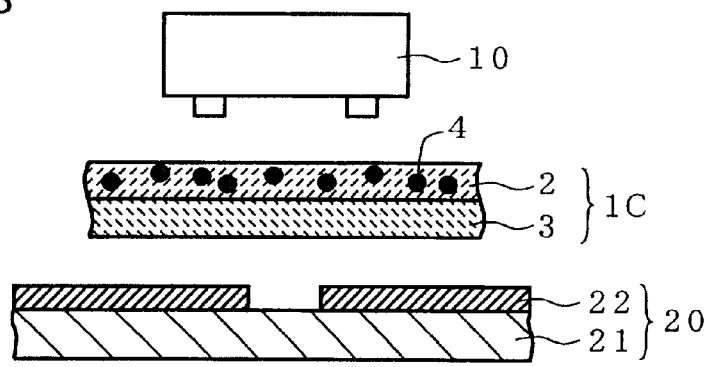
FIG. 3 is a descriptive diagram of a connection method pertaining to the present invention.

Moreover, as shown in FIG. 3, the electrically conductive particles 4 can be dispersed only in the first insulating adhesive layer 2, while not being dispersed in the second insulating adhesive layer 3. Furthermore, the anisotropic conductive adhesive film pertaining to the present invention can assume a multiple-layered structure containing three or more layers, where in addition to the two-layer insulating adhesive, in which each of the layers has a different modulus of elasticity after curing, other insulating adhesive layers can, according to need, be furnished between the first insulating adhesive layer 2 and the second insulating adhesive layer 3.

The anisotropic conductive adhesive film pertaining to the present invention can be used to connect various electronic components with circuit boards, as well as circuit boards with other circuit boards. Examples of circuit boards to which a connection can be made include polyester- and polyimide-based boards.

In particular, when IC chips or other semiconductor chips are to be flip-chip mounted on polyester-based circuit boards, it is possible to increase by a significant degree the adhesion and continuity reliability over that observed in conventional anisotropic conductive adhesive films, by disposing the first insulating adhesive layer 2 of the anisotropic conductive adhesive film pertaining to the present invention on the semiconductor chip side and the second insulating adhesive layer 3 on the circuit board side. Accordingly, the present invention encompasses the aforesaid connection methods as well as connected structure assemblies which have been connected according to the aforesaid connection methods.

EXAMPLES

The present invention shall be described below in further detail according to the examples.

Examples 1 to 10 and Comparative Examples 1 to 3

Films 1 to 5 of the compounding compositions given in Table 1 were formed to the thicknesses given in Tables 2 and 3. Dual-layer structure anisotropic conductive adhesive films were prepared by layering the resulting films in the combinations given in Tables 2 and 3, and allowing them to bond in contact with each other. Each of films 1 to 5 was cured to a thickness of 50 $\mu$m using a hot press, after which the moduli of elasticity after curing (30° C.) were determined using a dynamic viscoelasticity measuring device (Orientec). The results are assembled in Table 1.

Evaluation

A flexible circuit board having an aluminum wiring pattern bonded to a PET-based base film by means of a pressure-sensitive adhesive layer was connected to an IC chip (size: 4×4 mm; thickness: 0.15 mm) under applied heat and pressure (200° C.; 1N/bump; 10 sec) using the anisotropic conductive adhesive films from each working or comparative example.

The resulting connected structure assemblies were evaluated for (1) adhesive strength, (2) continuity reliability and (3) impact resistance in the manner described below. The results are assembled in Tables 2 and 3.

(1) Adhesive Strength

An IC chip was fixed to a glass plate, and the flexible circuit board was peeled away in a 90° direction at a 50 mm/min rate of pull; the peel strength at this time was measured. A peel strength of 4N/cm or more was judged to mean satisfactory connection reliability, 2N/cm or more to mean a somewhat diminished reliability, but satisfactory in terms of working performance, while any result below 2N/cm was judged as unsatisfactory.

(2) Continuity Reliability

Resistance values after an ageing treatment carried out in 60° C., 95% relative humidity for 500 hours which were less than two times the initial resistance values prior to the ageing treatment are ranked as "A", those which were two or more times but less than five times the values are ranked as "B", and those which were more than 5 times the values are ranked as "C".

(3) Impact Resistance

Resistance values obtained when a plastic rod was used to cause a light impact of approximately 1N in the periphery of the IC chip on the connected structure assembly of less than two times the initial resistance values prior to the impact are ranked as "A", those which were two or more times but less than five times the values are ranked as "B", and those which were more than five times the values are ranked "C".

TABLE 1

| | (units: weight parts) | | | | |
|---|---|---|---|---|---|
| | Film No. | | | | |
| Component | 1 | 2 | 3 | 4 | 5 |
| Solid epoxy resins (*1) | 35 | | | | |
| Hot latent curing agent (*2) | 65 | | | | |
| Acrylic rubber (*3) | | 55 | 55 | 55 | 55 |
| Urethane acrylate (*4) | | 30 | 40 | 15 | |
| Polyfunctional acrylate (*5) | | 10 | | 25 | 40 |
| Peroxide compound (*6) | | 5 | 5 | 5 | 5 |
| Electrically conductive particles (*6) | 15 | 15 | 15 | 15 | 15 |
| Modulus of elasticity after curing (30° C; GPa) | 2 | 0.02 | 0.05 | 0.5 | 0.3 |

Notes:
*1: Yuka Shell Epoxy KK; EP1009
*2: Asahi Ciba Co.; HX3941HP
*3: Teikoku Kagaku Co., WS-023
*4: Arakawa Kagaku Kogyo Co., Beamset 504H
5*: Toagosei [Chemical Industry Co. Ltd.], Aronix M315
*6: Nippon Yushi Co., Percure WO
*7: nickel particles, 5$\mu$ or less in diameter

TABLE 2

| | Examples | | | | | | | | | |
|---|---|---|---|---|---|---|---|---|---|---|
| | 1 | 2 | 3 | 4 | 5 | 6 | 7 | 8 | 9 | 10 |
| Film 1 | CS*8 | CS | CS | CS | CS | CS | CS | CS | CS | CS |
| ($\mu$m) | 25 | 20 | 15 | 10 | 5 | 15 | 15 | 27 | 3 | 15 |
| Film 2 | BS*9 | BS | BS | BS | BS | — | — | BS | BS | — |
| ($\mu$m) | 5 | 10 | 15 | 20 | 25 | — | — | 3 | 27 | — |
| Film 3 | — | — | — | — | — | BS | — | — | — | — |
| ($\mu$m) | — | — | — | — | — | 15 | — | — | — | — |
| Film 4 | — | — | — | — | — | — | BS | — | — | — |
| ($\mu$m) | — | — | — | — | — | — | 15 | — | — | — |
| Film 5 | — | — | — | — | — | — | — | — | — | BS |
| ($\mu$m) | — | — | — | — | — | — | — | — | — | 15 |
| Ratio of film thickness (CS/BS)*10 | 5 | 2 | 1 | 0.5 | 0.2 | 1 | 1 | 9 | 0.11 | 1 |
| Ratio of modulus of elasticity of cured films (CS/BS) | 100 | 100 | 100 | 100 | 100 | 40 | 20 | 100 | 100 | 6.7 |
| Adhesive strength (N/cm) | 4.2 | 5.8 | 8.0 | 8.2 | 8.5 | 8.9 | 8.4 | 3.2 | 8.7 | 2.9 |
| Continuity reliability | A | A | A | A | A | A | A | A | B | A |
| Impact resistance | A | A | A | A | A | A | A | A | B | A |

Note:
*8Chip side
*9Board side
*10(Chip side/Board side)

TABLE 3

|  | Comparative Examples | | |
|---|---|---|---|
|  | 1 | 2 | 3 |
| Film 1 | BS | — | — |
| ($\mu$m) | 15 | 30 | — |
| Film 2 | CS | — | — |
| ($\mu$m) | 15 | — | 30 |
| Ratio of film thickness (CS/BS) | 1 | — | — |
| Ratio of modulus of elasticity of cured films (CS/BS) | 0.01 | — | — |
| Adhesive strength (N/cm) | 2.5 | 1.2 | 7.8 |
| Continuity reliability | C | A | C |
| Impact resistance | C | A | C |

The results from Tables 2 and 3 indicate that the adhesion was low in Comparative Example 2, where epoxy-based film 1 (modulus of elasticity: 2 GPa) was used in a single layer, and that continuity reliability and impact resistance were poor in Comparative Example 3, where acrylate-based film 2 (modulus of elasticity: $2 \times 10^{-2}$ GPa) was used in a single layer. Moreover, even when films 1 and 2 were used in a dual-layer structure, as in Comparative Example 1, where film 1 was disposed on the board side and film 2 was disposed on the chip side, the data indicate that the adhesive strength was comparatively low, and the continuity reliability and impact resistance were poor.

In contrast to the above results, Examples 1 to 10, in which epoxy-based film 1 (modulus of elasticity: 2 GPa) was disposed on the chip side and acrylate-based films 2 to 5 (modulus of elasticity: $2 \times 10^{-2}$ to $3 \times 10^{-1}$ GPa) were disposed on the board side, exhibited excellent adhesive strength, continuity reliability and impact resistance. Examples 1 to 7, in which the modulus of elasticity ratio of film 1 and films 2 to 5 were 10 or greater and the thickness ratio was between 0.15 and 7 inclusive, exhibited even greater adhesive strength, continuity reliability and impact resistance.

According to the anisotropic conductive adhesive film pertaining to the present invention, high adhesion and continuity reliability can be achieved, even when mounting electronic components such as IC chips on polyester-based flexible circuit boards.

The entire disclosure of the specification, claims and drawings of Japanese Patent Application No. 2000-050180 filed on Feb. 25, 2000 is hereby incorporated by reference.

What is claimed is:

1. An anisotropic conductive adhesive film, comprising a first insulating adhesive layer, a second insulating adhesive layer whose modulus of elasticity after being cured is less than the modulus of elasticity of the cured first insulating adhesive layer, and electrically conductive particles which are dispersed in at least either the first insulating adhesive layer or the second insulating adhesive layer, wherein the ratio $c_1/c_2$ between the modulus of elasticity $c_1$ of the cured first insulating adhesive layer and the modulus of elasticity $c_2$ of the cured second insulating adhesive layer is at least 10, and an insulating resin used in the first insulating adhesive layer is different from an insulating resin used in the second insulating adhesive layer.

2. The anisotropic conductive adhesive film according to claim 1, wherein the ratio $t_1/t_2$ between the thickness $t_1$ of the first insulating adhesive layer and the thickness $t_2$ of the second insulating adhesive layer is between 0.15 and 7 inclusive.

3. The anisotropic conductive adhesive film according to claim 1, wherein the first insulating adhesive layer comprises a thermosetting epoxy adhesive in which is employed an imidazole-based latent curing agent and the second insulating adhesive layer comprises a thermosetting acrylate adhesive in which is employed a peroxide-based curing agent.

4. The anisotropic conductive adhesive film according to claim 1, wherein the electrically conductive particles are dispersed in the second insulating adhesive layer.

5. A method for electrically and mechanically connecting a semiconductor chip with a circuit board by using the anisotropic conductive adhesive film according to claim 1, wherein the first insulating adhesive layer of the anisotropic conductive adhesive film is disposed on the chip side and the second insulating adhesive layer is disposed on the circuit board side.

6. The connecting method according to claim 5, wherein the circuit board is a polyester-based circuit board.

7. A connected structure assembly having a semiconductor chip and a circuit board electrically and mechanically connected thereto by using the anisotropic conductive adhesive film according to claim 1, wherein the cured first insulating adhesive layer of the anisotropic conductive adhesive film is bonded to the semiconductor chip and the cured second insulating adhesive layer is bonded to the circuit board.

8. The connected structure assembly according to claim 7, wherein the circuit board is a polyester-based circuit board.

* * * * *